(12) United States Patent
Herr et al.

(10) Patent No.: US 10,777,263 B1
(45) Date of Patent: Sep. 15, 2020

(54) JOSEPHSON MEMORY AND LOGIC CIRCUITS USING QUASI-LONG-JUNCTION INTERCONNECT

(71) Applicants: Quentin P. Herr, Ellicott City, MD (US); Anna Y. Herr, Ellicott City, MD (US)

(72) Inventors: Quentin P. Herr, Ellicott City, MD (US); Anna Y. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/392,330

(22) Filed: Apr. 23, 2019

(51) Int. Cl.
| | |
|---|---|
| G11C 11/00 | (2006.01) |
| G11C 11/44 | (2006.01) |
| H03K 19/195 | (2006.01) |
| B82Y 10/00 | (2011.01) |
| H01L 39/22 | (2006.01) |
| H03K 3/38 | (2006.01) |

(52) U.S. Cl.
CPC ............ G11C 11/44 (2013.01); B82Y 10/00 (2013.01); H01L 39/223 (2013.01); H03K 3/38 (2013.01); H03K 19/195 (2013.01); H03K 19/1952 (2013.01)

(58) Field of Classification Search
CPC .. G11C 11/44; H03K 19/195; H03K 19/1952; H03K 3/38
See application file for complete search history.

(56) References Cited

U.S. PATENT DOCUMENTS

| | | | | |
|---|---|---|---|---|
| 5,872,731 | A * | 2/1999 | Chan | G11C 11/44 257/36 |
| 6,078,517 | A * | 6/2000 | Herr | G11C 11/44 365/160 |
| 7,443,719 | B2 * | 10/2008 | Kirichenko | G11C 8/10 365/160 |
| 9,281,057 | B1 * | 3/2016 | Herr | G11C 11/44 |
| 9,520,181 | B1 | 12/2016 | Miller et al. | |
| 10,204,677 | B1 | 2/2019 | Luo et al. | |

OTHER PUBLICATIONS

Dayton I M et al: "Experimental demonstration of a Josephson magnetic memory cell with a programmable pi-junction", ARXIV. ORG, Cornell University Library, 201 OLIN Library Cornell University Ithaca, NY 14853, Nov. 6, 2017 (Nov. 6, 2017), XP081319537, DOI: 10.1109/LMAG.2018.2801820 paragraph [0011]; figure 1.
International Search Report for PCT/US2020/023144 dated Jun. 24, 2020.

\* cited by examiner

*Primary Examiner* — Pho M Luu
(74) *Attorney, Agent, or Firm* — Tarolli, Sundheim, Covell & Tummino LLP

(57) ABSTRACT

A Josephson memory array and logic circuits use quasi-long-Josephson-junction interconnects to propagate signals at fast speeds and low energy expense, while permitting for memory arrays as dense fabrics of relatively simple unit cell sub-circuits, which include it Josephson junctions, connected together by the interconnects. Each of the unit cell sub-circuits can be configured as a looped or linear arrangement. The unit cell sub-circuits and interconnects provide a fast, dense memory technology for reciprocal quantum logic (RQL), suitable for low-level caches and other memories collocated with an RQL processor.

21 Claims, 16 Drawing Sheets

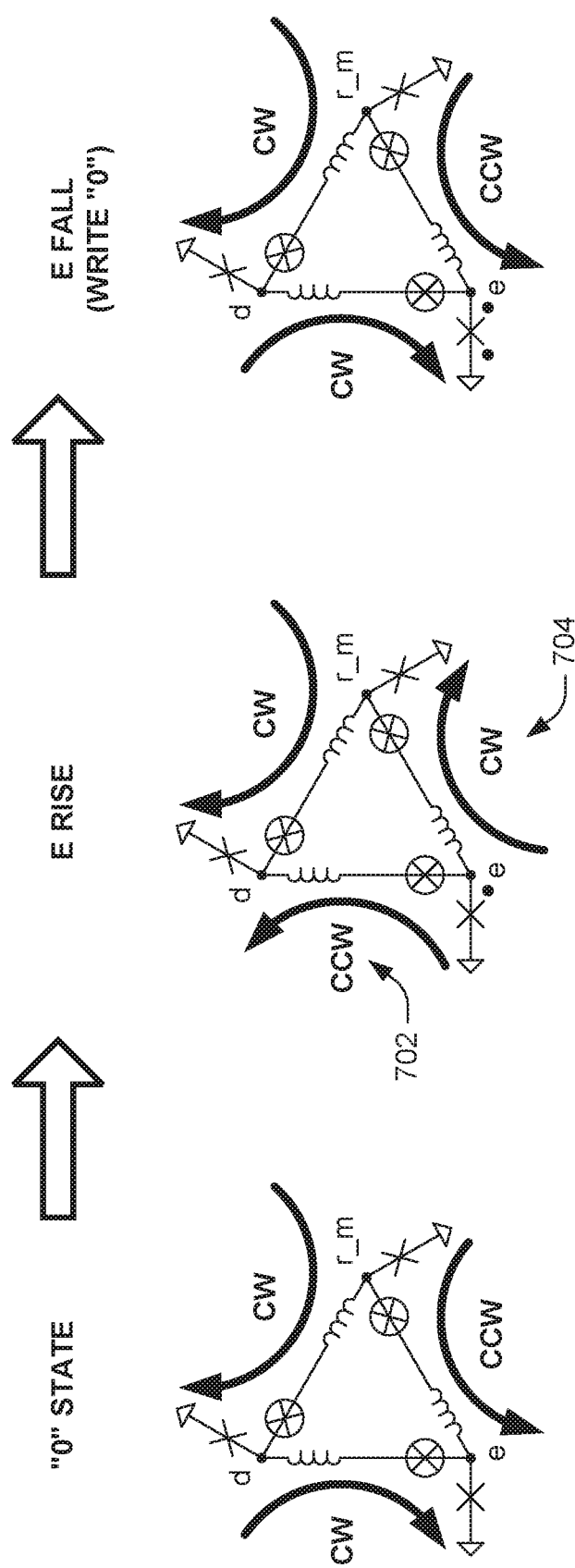

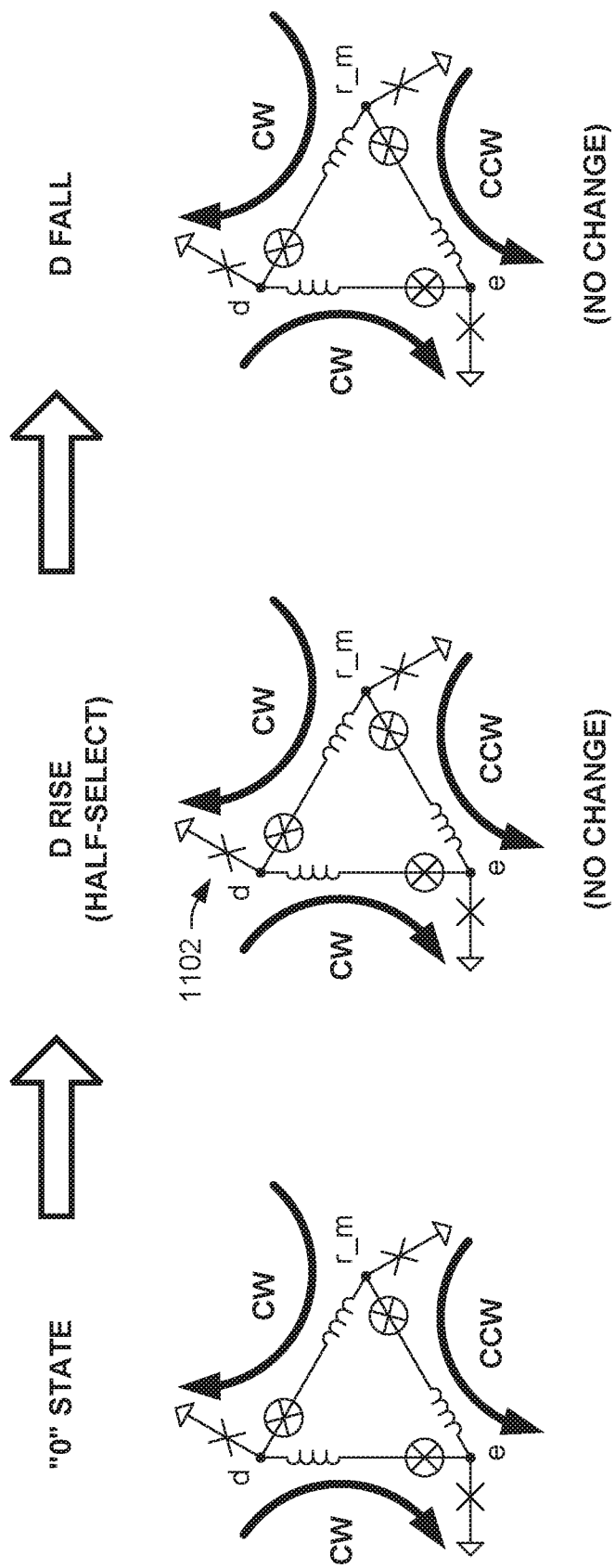

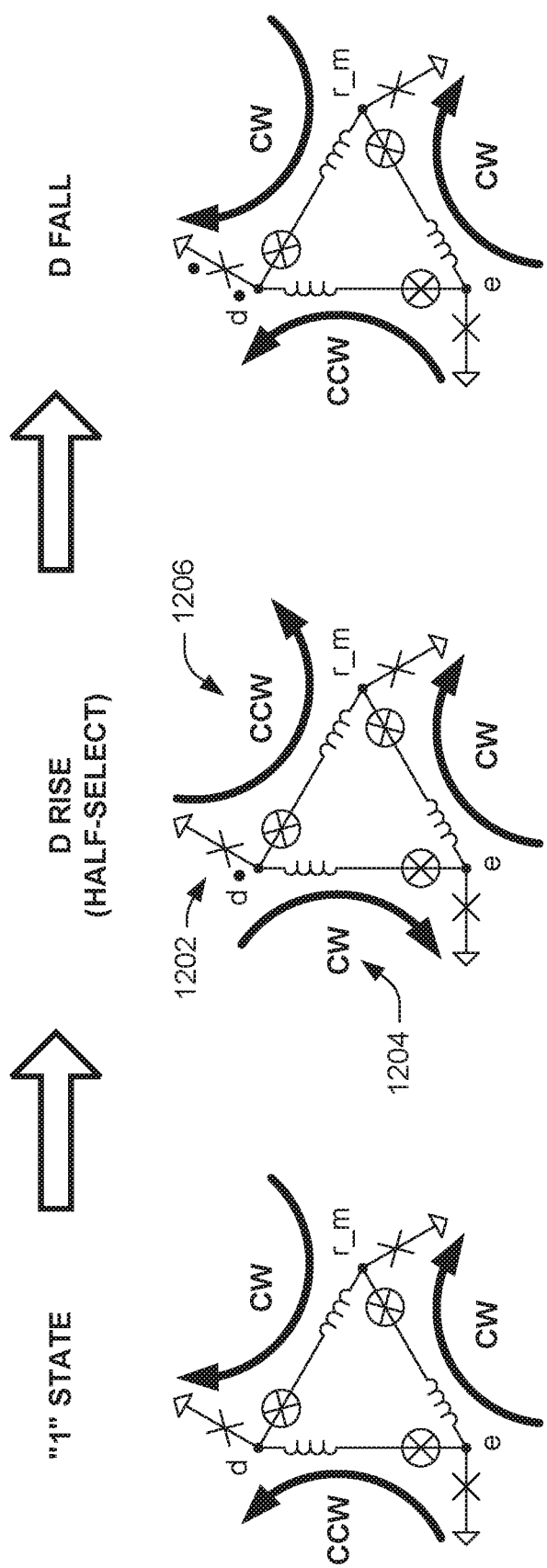

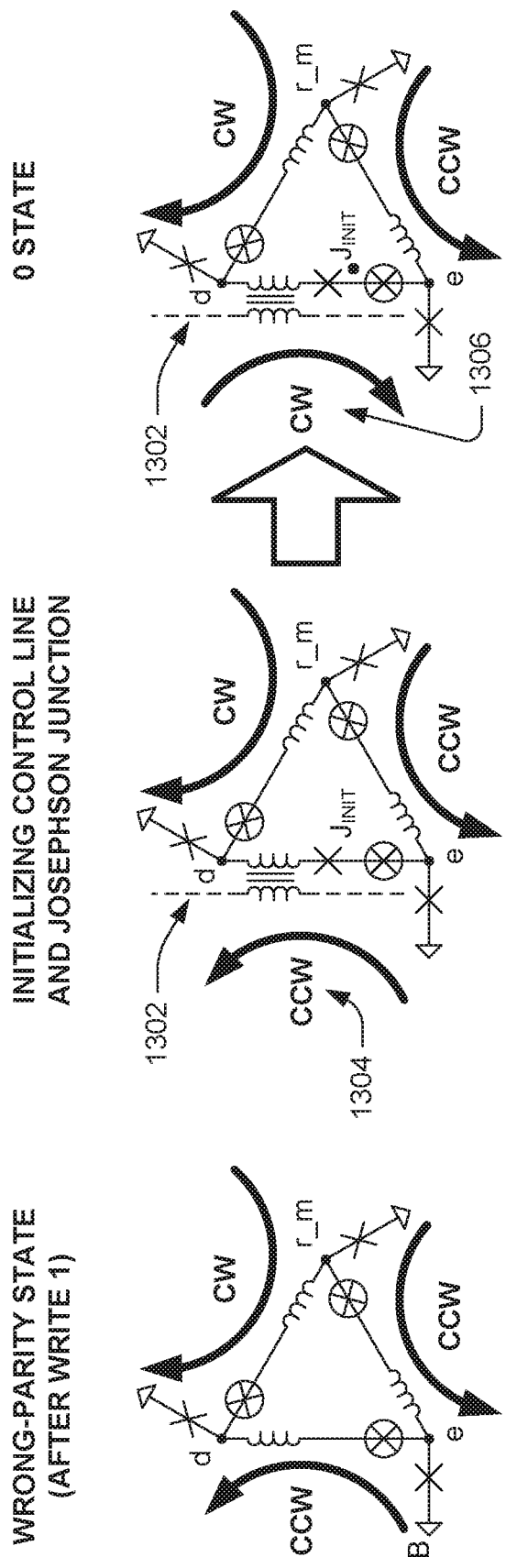

US 10,777,263 B1

JOSEPHSON MEMORY AND LOGIC CIRCUITS USING QUASI-LONG-JUNCTION INTERCONNECT

TECHNICAL FIELD

The present invention relates generally to quantum and classical digital superconducting circuits, and specifically to Josephson memory and logic circuits using a quasi-long-junction interconnect.

BACKGROUND

In the field of digital logic, extensive use is made of well known and highly developed complementary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nanowatts (nW), at a typical data rate of 20 gigabits per second (Gb/s) or greater, and operating temperatures of around 4 kelvins.

A non-destructive readout (NDRO) circuit is a circuit that can retrieve a stored information state (e.g., one or multiple bits) for transmission to other circuitry for processing or output without erasing, destroying, changing, or otherwise corrupting the stored information state. For the purposes of this description, the term NDRO should not be interpreted to include circuits that destructively retrieve a stored information state but then thereafter perform a restorative write-back.

Reciprocal quantum logic (RQL) is a family of low-power superconducting circuits. In wave-pipelined RQL, a logical "1" can be encoded as a positive single flux quantum (SFQ) pulse followed by a reciprocal negative pulse, whereas a logical "0" can be encoded as the absence of either such pulse.

SUMMARY

One example includes a Josephson memory array having a plurality of unit cells, each of the plurality of unit cells having an internal sub-circuit coupled to at least first, second, third, and fourth quasi-long-Josephson-junction interconnects. The unit cell includes a plurality of it Josephson junctions. Each of the first, second, third, and fourth quasi-long-Josephson-junction interconnects is coupled to the internal sub-circuit at a different electrical node of the sub-circuit. The interconnects include a write enable line configured to enable writing a binary memory state to the unit cell, a read enable line configured to enable reading the binary memory state from the unit cell, a data input line configured to provide the binary memory state to the unit cell, and a bit line configured to read out the binary memory state from the unit cell. Each of the first, second, third, and fourth quasi-long-Josephson-junction interconnects is adapted to connect together multiple ones of the plurality of unit cells in the memory array.

Another example includes a method of memory access in a non-destructive superconducting memory array. A pilot voltage pulse is propagated at least partway down a quasi-long-Josephson-junction interconnect arranged as a bit line coupled to a plurality of memory unit cells in the superconducting memory array at respective data output nodes. The bit line is configured to provide data output from the memory unit cells in the superconducting memory array. The bit line has a terminus at the periphery of the memory array. At each respective data output node, the pilot voltage pulse is either continued to be propagated down the bit line, or absorbed, based on a direction of a superconducting current circulating in a respective arm of one of the plurality of memory unit cells coupled to the respective data output node. A binary memory state of the addressed one of the plurality of memory unit cells is determined based on whether the pilot voltage pulse propagates to the terminus of the bit line.

Yet another example includes a method of memory writing in a superconducting memory array. A data voltage pulse is propagated down a quasi-long-Josephson-junction interconnect arranged as a data input line coupled to a plurality of memory unit cells in the superconducting memory array at respective data input nodes. The data input line is configured to provide data input to the memory unit cells in the superconducting memory array. Based on the propagating the data voltage pulse, the directions of superconducting currents, circulating in different current paths of an addressed one of the memory unit cells, are reversed. For example, two of three superconducting currents in the addressed memory unit cell can be reversed. A written binary memory state of the addressed memory unit cell is based on the directions of the three superconducting currents.

BRIEF DESCRIPTION OF THE DRAWINGS

FIGS. 7A-7C are circuit current configuration diagrams showing a write "0" operation from a starting "0" state.

FIGS. 11A-11C are circuit current configuration diagrams showing a half-select condition from a starting "0" state.

FIGS. 12A-12C are circuit current configuration diagrams showing a half-select condition from a starting "1" state.

FIGS. 13A-13C illustrate example initialization protocols to initialize all cells to a known and valid initial memory state in the example memory unit cell of FIG. 2.

DETAILED DESCRIPTION

Quasi-long-junction interconnects can be used, instead of Josephson transmission lines (JTLs) or passive transmission lines (PTLs), in non-destructive readout (NDRO) circuits to create a fast, dense reciprocal quantum logic (RQL) memory array. Logic circuits, such as an address decoder associated with such a memory array, can include similar circuits as those used in the memory and can thereby operate on the same principles. The circuits can advantageously incorporate it-junctions in addition to standard Josephson junctions. Fast, low-power, low-latency RQL logic benefits from a suitable memory technology that is similarly fast, low-power, and low-latency. This is particularly true for low-level cache memory. Accordingly, the circuits described herein provide a fast, dense memory technology for RQL, suitable for low-level caches and other memories collocated with an RQL processor, thus filling a critical technology gap.

In some examples, the circuits described herein offer a more efficient implementation of an RQL NDRO memory array than of the type described in U.S. Pat. No. 10,554,207, issued Feb. 4, 2020, and entitled "Superconducting Non-Destructive Readout Circuits," which is herein incorporated by reference. For convenience of reference, the NDRO circuit topology described therein will herein be referred to as the "body-tails NDRO." An example memory cell incorporating the circuits described herein has a similar logic behavior as a body-tails NDRO-based memory cell, featuring x-y addressing for writes, but with multiplexor logic for reads. As with a memory cell based on the body-tails NDRO, both write and read operations are word-organized at the array level. In contrast to the body-tails NDRO, however, the presently described circuits advantageously make use of a quasi-long-junction interconnect among cells in the array, which is fast and power-efficient. Also described herein is an implementation of the unit cell that is physically small (i.e., using a frustrated array of Josephson junctions and it-junctions) and with symmetric states (i.e., multi-fold degeneracy). The degeneracy minimizes fan-out requirements on the address lines. The present description further describes use of quasi-long-junction interconnect for the NOR-gate-based readout.

Figure 1:
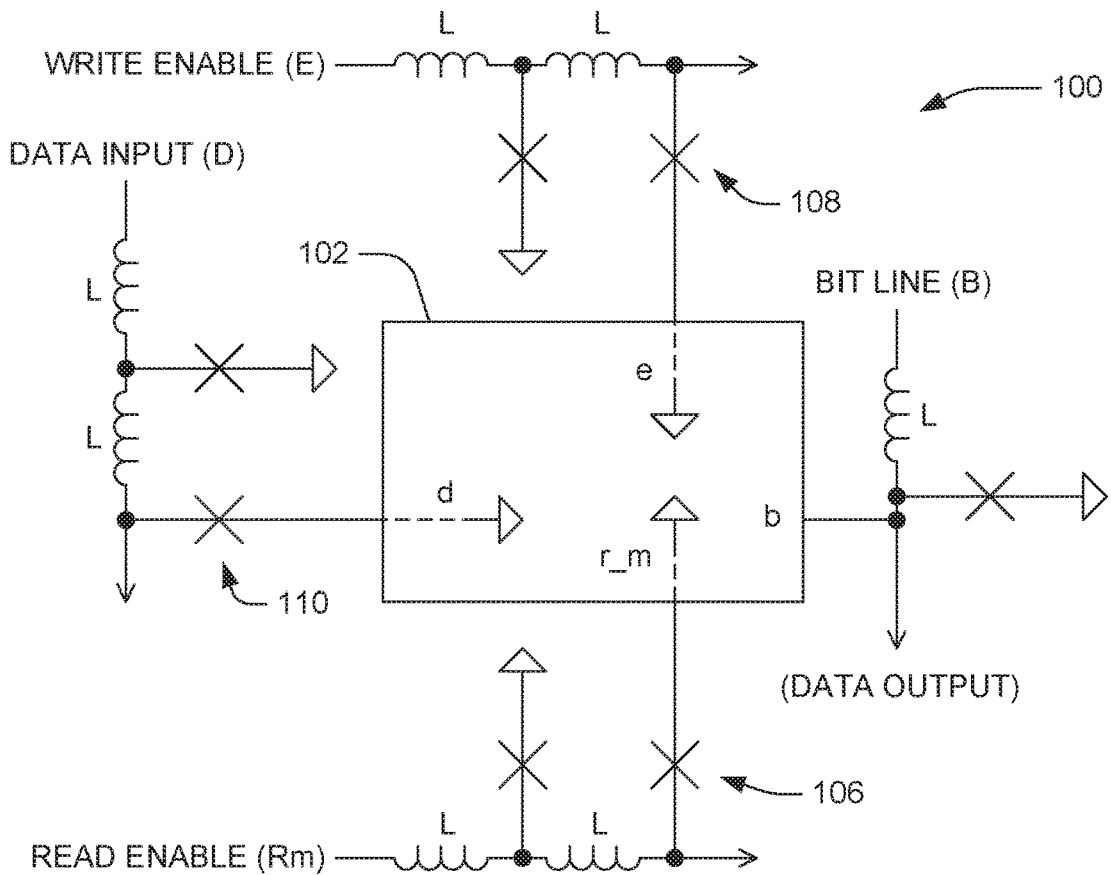
FIG. 1 is a block/circuit diagram of an example Josephson memory or logic circuit using a quasi-long-Josephson-junction interconnect.

FIG. 1 shows a schematic of a unit cell 100 that can be tiled to make a memory array. Address lines E (write enable) and Rm (read enable) feed sub-circuit 102, which receives data input on line D, and outputs data on bit line B. These address lines and data lines each form interconnects that use only small-value interconnect inductors L, e.g., having an inductance value of between about one picohenry and about ten picohenries, e.g., between about one picohenry and about five picohenries, making the resultant memory array small, fast, and power-efficient. Inputs to sub-circuit 102 are provided through floating Josephson junctions 106, 108, 110, which are also referred to herein as escape junctions. As viewed across the tiled memory array, the address and data lines are quasi-long Josephson junctions, in that they retain the signal propagation characteristics of long Josephson junctions, without necessarily retaining the capability of being analyzed by the same analytical formula applicable to long Josephson junctions, for reason that there are other components between floating Josephson junctions 106, 108, 110 and their respective connections to ground, as indicated by the broken lines inside sub-circuit 102.

The following description provides an explanation of the meaning of "quasi-long Josephson junction" ("quasi-LJJ") as that term is used in the present description. In a typical Josephson transmission line (JTL), such as one configured as an interconnect between different RQL gates, memory cells, or other circuit elements, a line of parallel Josephson junctions connected to ground at one end of each are linked with each other by interconnect inductors at the other end, and when one Josephson junction in the JTL is triggered by an incoming single flux quantum (SFQ) pulse, it triggers the next Josephson junction in the JTL, and so on down the line, with each Josephson junction triggering distinctly from its neighbors.

A lumped-element long Josephson junction (LJJ) can resemble a JTL but with the interconnect inductors made to be much smaller, e.g., between about one picohenry and about ten picohenries, e.g., between about one picohenry and about five picohenries, or in other words about ten times smaller than in a typical JTL. In such an LJJ, and in contrast to the functional behavior of a JTL, the way in which the Josephson junctions trigger is distinct from that observed in a typical JTL: the signal propagation instead exhibits a wavelike behavior, with the triggering not localizable to any particular Josephson junction in the LJJ as compared to the triggering of its neighboring Josephson junctions. The transmitted SFQ pulse then becomes a soliton traveling through the nonlinear medium of the lumped-element LJJ. "Lumped-element" in this context is used to distinguish the LJJ structure from LJJs that are true continuous Josephson junctions, rather than, as with a lumped-element LJJ, a set of discrete Josephson junctions linked by very small interconnect inductors.

Because of their relatively poor performance at reliably transmitting signals over the relatively long chip layout distances frequently associated with inter-gate connections, lumped-element LJJs are typically not practical as logic interconnects. However, LJJs are capable of passing pulses at very fast speeds and with much lower energy usage than JTL interconnects, and require less damping and applied power, when the transmission distance is low. LJJs therefore are well-suited to usage as interconnects in a memory array, where there is a very tight fabric of elements (i.e., the individual memory cells of the array) with relatively small distances between each of the elements. In such an LJJ, pulses are not transmitted at the speed of light as they would be through a passive transmission line, but the LJJ interconnection permits maintaining pulse integrity over the associated small transmission distances.

The LJJ interconnects as provided to memory cells (as shown in FIG. 1) are referred to herein as "quasi-long Josephson junctions" ("quasi-LJJs"). Whereas an analytical formula can be used to analyze LJJs consisting only of Josephson junctions and interconnect inductors, the same such formula does not apply to analyze LJJs where some of the Josephson junctions are connected to ground only indirectly by memory unit cells, such that true LJJ dynamics are not achieved. In such case, the behavior cannot be analytically reduced to a simple formula, as with lumped-element LJJs. Although quasi-LJJ interconnects as viewed across an entire memory array do not analytically behave as true LJJs, the key features of very fast signal propagation and no fan-out are preserved. Accordingly, "quasi-long Josephson junction," as that term is used herein, means a JTL structure with small linking inductance values (e.g., between about one picohenry and about ten picohenries, e.g., between about one picohenry and about five picohenries) characteristic of an LJJ and wherein at least some of the Josephson junctions do not terminate directly to ground on the side opposite the signal transmission path, but instead terminate to ground indirectly within a memory unit cell sub-circuit.

The memory unit cell 100 has the same logical operation as the body-tails NDRO memory, but uses an interconnect that can be smaller and faster. Instead of using JTL-based splitter networks to distribute signals, unit cell 100 uses simple JTL chains that do not fan out and can have very small inductor values. The small inductor values enable quasi-long junction dynamics, where power and damping can be reduced relative to a JTL-based splitter network approach. The interconnect is physically compact and fast. There are effectively three inputs to the internal sub-circuit 102 of unit cell 100, labeled d, e, and r_m, corresponding respectively to data input, write enable, and read enable lines D, E, and Rm, as well as one output b, corresponding to the bit line B on which data read from the memory unit cell 100 is output. As indicated by the broken lines in the box schematic of internal sub-circuit 102 of memory cell 100, each of d, e, and r_m inputs are tied to ground through some component or set of components.

The "m" designation (for "mirrored") in the name assigned to the read enable line Rm and the sub-circuit node r_m indicates that the corresponding assertion signal is mirrored from that of the other signals shown (E, D B). For example, if the other signals (E, D, B) are asserted using a positive pulse followed by a negative pulse, according to the typical positive-negative pulse pair encoding convention frequently used to indicate logical assertion in wave-pipelined RQL, then in the signals propagated along read enable line Rm, a negative pulse is transmitted before a positive pulse in the reciprocal pulse pair to indicate logical assertion. Suitable polarity inverter circuits can be provided only at the periphery of a tiled memory array, so as to achieve the polarity-inverted signals Rm supplied along the read enable lines, rather than having to provide an inverter to each unit cell 100 in the array. Examples of suitable polarity inverter circuits can be found in U.S. Pat. No. 10,090,841 B1, entitled "Josephson Polarity and Logical Inverter Gates."

Figure 2:
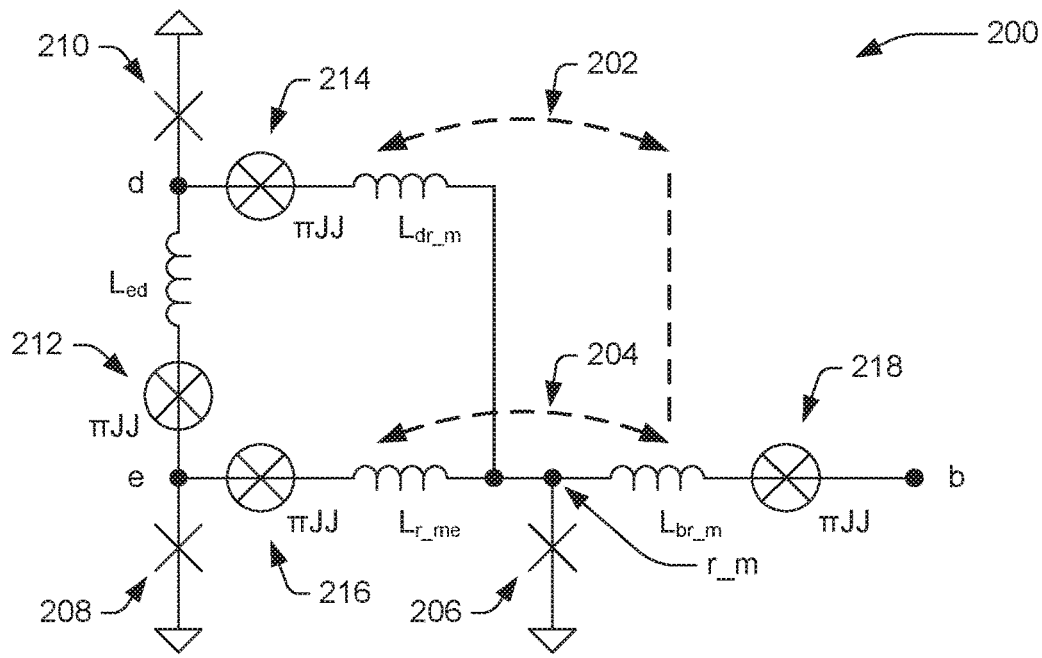
FIG. 2 is a circuit diagram of an example internal sub-circuit of a memory unit cell having a circular configuration.

FIG. 2 illustrates an example internal sub-circuit 200 of a memory unit cell, having a circular configuration. Thus, sub-circuit 200 can correspond to internal sub-circuit 102 in FIG. 1. (Another example internal sub-circuit is described with respect to, and illustrated in, FIG. 16.) The illustrated unit cell internals 200 have a circular structure between the d, e, and r_m input nodes. Phase shifter elements are implemented as π Josephson junctions 212, 214, 216, 218. The b readout node is connected to the r_m input node via π Josephson junction 218 and inductor $L_{br\_m}$ as shown. Mutual inductance coupling 202 can be provided between inductor $L_{dr\_m}$ and inductor $L_{br\_m}$. Similarly, mutual inductance 204 can be provided between $L_{r\_me}$ and inductor $L_{br\_m}$. These mutual inductances can be provided to tune the potential energy levels of the different states to be equal.

Considering schematic 200 of FIG. 2 in tandem with the external quasi-LJJs shown in schematic 100 of FIG. 1, there are two Josephson junctions in series before each respective quasi-LJJ is connected to ground: Josephson junction pairs 106, 206; 108, 208; and 110, 210. Thus, every time a pulse is propagated along one of the quasi-LJJs, one or the other of those two Josephson junctions triggers. As such, each quasi-LJJ continues to act as a pulse repeater and to send a pulse along, but it does not have the ideal behavior that a true LJJ would have. The use of quasi-LJJs permits the pulses to propagate fast and enables very compact physical layout for a tiled memory. Moreover, the total configuration (e.g., schematics 100 and 200 considered together) allow for the quasi-LJJs not to have to split into different JTLs in order to feed into different memory unit cells, because a pulse propagating along one of the quasi-LJJs can impact the sub-circuit 102 as it goes by, without necessitating fan-out.

Figure 3:
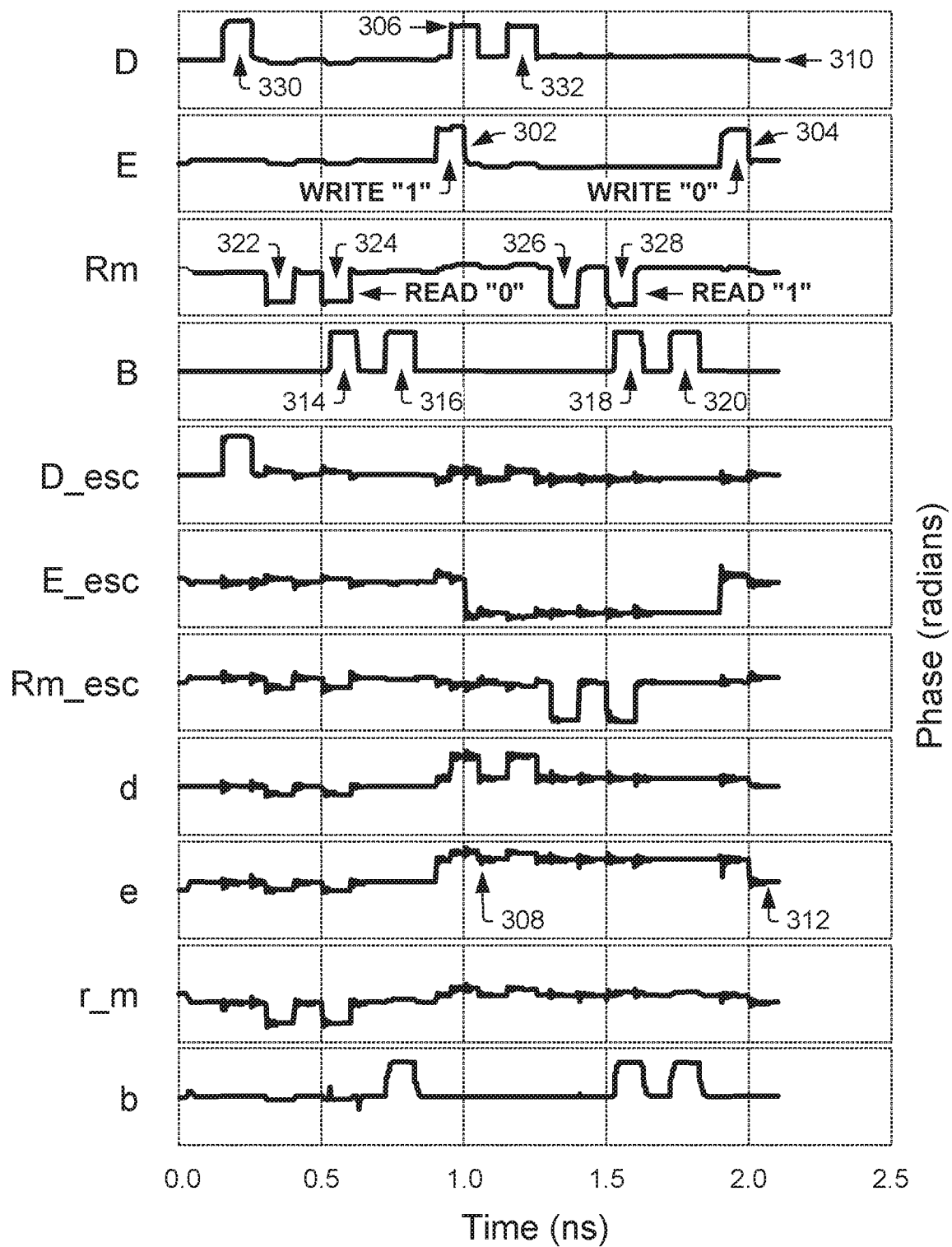
FIGS. 3 and 4 are timing diagrams illustrating an example operation of an NDRO unit cell, with FIG. 4 showing an energy graph.

The timing diagram of FIG. 3 illustrates an example operation of an NDRO unit cell like that of FIGS. 1 and 2 in physical-level simulation in SPICE, with the traces representative of phase over time in nanoseconds. Successive positive-then-negative or negative-then-positive steps in the traces indicative of signal logical assertion within a clock cycle will be referred to as phase pulses, to distinguish them from voltage pulses (e.g., SFQ pulses). Each phase pulse seen in the traces is formed by a reciprocal pair of voltage pulses propagating through the circuit.

During data write operations, the internal logical state of the unit cell is updated to the present logical state of the data input (D) upon a falling edge of a phase pulse corresponding to an assertion of the write enable (E) input. The timing diagram shows two such assertions of the write enable (E) input having respective falling edges 302, 304 at the first and second nanosecond marks, respectively. At the time of the falling edge 302 of first write enable (E) assertion, the data input (D) signal phase is high 306, changing the internal state from logical "0" to logical "1", as can be seen by the rise to a high phase value 308 at internal node e. At the time of the falling edge 304 of second write enable (E) assertion, the data input (D) signal phase is low 310, and accordingly the internal state is changed from logical "1" back to logical "0", as can be seen by the return to a low phase value 312 at internal node e.

As illustrated, the read enable waveform Rm has inverted polarity with respect to the other waveforms, i.e., low phase signal portions indicate logical assertion, meaning that a negative voltage pulse (e.g., an SFQ pulse) brings the signal phase low (to assert Rm) and a subsequent positive voltage pulse (e.g., an SFQ pulse) brings the signal phase high again (to deassert Rm). During data read operations, in addition to the read enable signal Rm being asserted, corresponding to a read enable phase pulse propagating through the fabric of tiled memory units in the word direction (i.e., horizontally in FIG. 1), what is known as a "pilot phase pulse" or "interrogation phase pulse" propagates through the memory fabric in the orthogonal direction (i.e., vertically in FIG. 1), with one such pilot phase pulse propagating for each bit to be read. The pilot phase pulse propagates through all the unit cells in the fabric and emerges at the bottom periphery of the memory, except if the unit cell being read (as designated by the vertex between the issued pilot phase pulse and the read enable phase pulse) is in the logical "1" state, in which case the pilot phase pulse will be blocked (at the location of the unit cell), and will not emerge at the bottom periphery of the memory. Thus, the memory functions according to an inverting read, wherein an unasserted signal emerging from the bit line (B) is indicative of a logical "1" memory state having been read, and an asserted signal—as asserted initially by the pilot phase pulse—emerging from the bit line (B) is indicative of a logical "0" memory state having been read.

In the illustrated example, two pilot pulses are issued on the bit line (B) in quick succession every nanosecond, for a total of four pilot pulses 314, 316, 318, 320. Only two of the pilot pulses, 314, 318, correspond to read operations on the observed unit cell; the other two pilot pulses 316, 318 are possibly for read operations on other unit cell(s) in the same column. Also in the illustrated example, two read enable pulses are issued on the read enable line (Rm) in quick succession every nanosecond, for a total of four read enable pulses 322, 324, 326, 328. Only two of the read enable pulses, 324, 328, correspond to read operations on the observed unit cell; the other two read enable pulses 322, 326 are possibly for read operations on other unit cell(s) in the same row. The effect of the memory state along the bit line is indicated in the timing diagram by the phase at node b (i.e., the bottom trace in FIG. 3), which trace follows the bit line signal (B), except that a pulse corresponding to the first pilot pulse 314 is missing from the node b phase trace, because on the first read operation, at the intersection between pilot phase pulse 314 and the contemporaneous phase pulse 324 on the read enable signal line (Rm), the pilot phase pulse is blocked. Data input pulses 330, 332 correspond to half-select conditions, i.e., where a phase pulse is issued on the data input line (D) without a contemporaneous write pulse being issued on the write enable line (E).

The following truth table relates the effect of phase pulses within a clock cycle on the input lines and the phase at node b. The numbers in parentheses at the beginning of each line indicate the relative order in which the listed operations appear in the timing diagram of FIG. 3.

|  | D | E | ~Rm | B | Previous state | New state | b |
|---|---|---|---|---|---|---|---|
| (1) Quiescent inputs | 0 | 0 | 0 | 0 | 0 or 1 | Prev. | 0 |
| (5, 10) Pilot pulse transit | 0 | 0 | 0 | 1 | 0 or 1 | Prev. | 1 |
| (3, 8) Read enable pulse transit | 0 | 0 | 1 | 0 | 0 or 1 | Prev. | 0 |
| (4) Read 0 | 0 | 0 | 1 | 1 | 0 | 0 | 0 |
| (9) Read 1 | 0 | 0 | 1 | 1 | 1 | 1 | 1 |
| (11) Write 0 | 0 | 1 | 0 | 0 | 0 or 1 | 0 | 0 |
| (2, 7) Half select | 1 | 0 | 0 | 0 | 0 or 1 | Prev. | 0 |
| (6) Write 1 | 1 | 1 | 0 | 0 | 0 or 1 | 1 | 0 |

Figure 4:
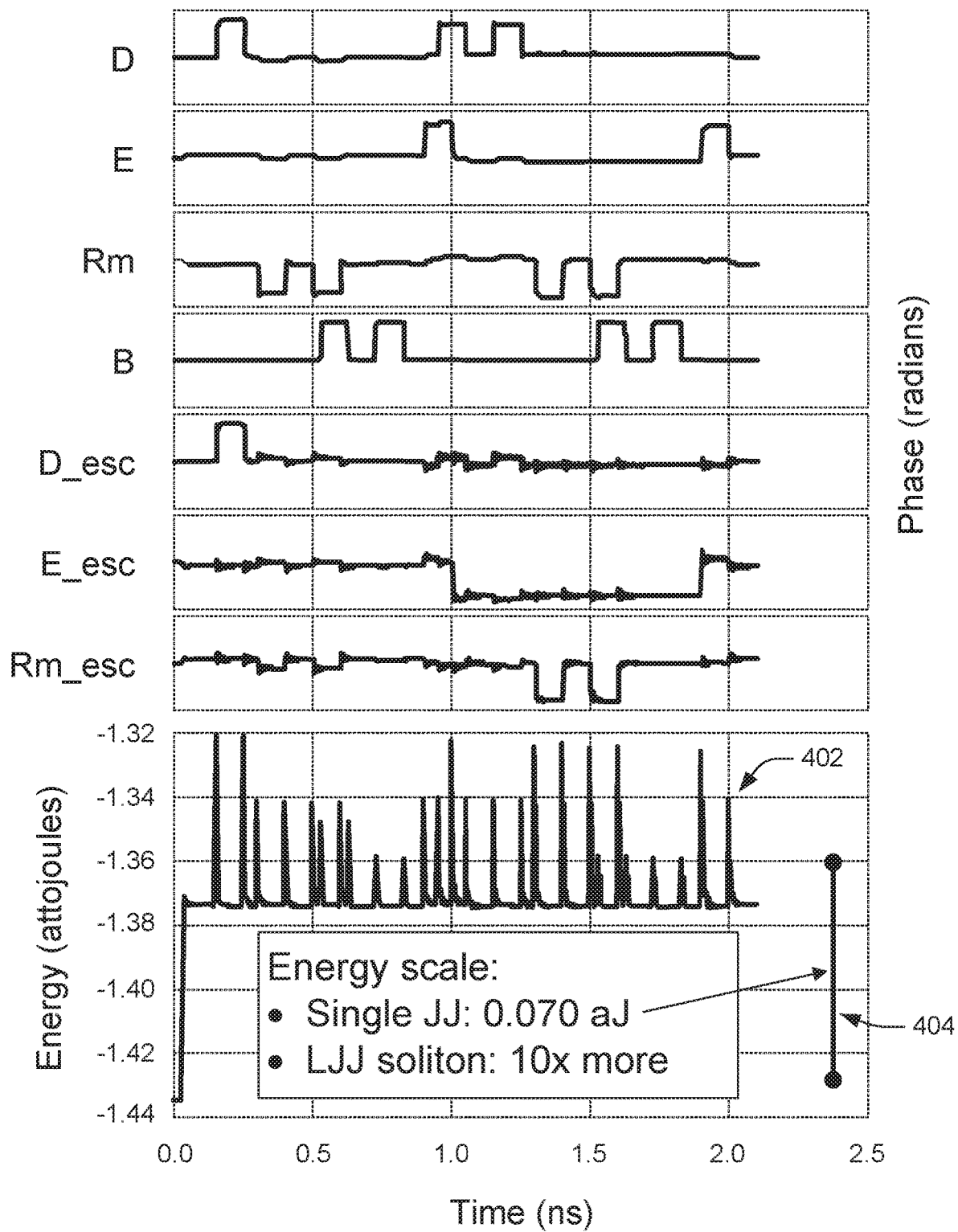

As can be seen in the potential energy plot 402 of FIG. 4 (which drawing otherwise duplicates the timing diagram of FIG. 3), apart from switching transients that appear as brief spikes in the potential energy plot 402, the total potential energy of the unit cell in the different states is shown to be equal, which provides the advantage that the address lines (D, E, Rm, B) do not need to provide power gain or fan-out. This enables the quasi-long-junction interconnect, which does not have explicit fan-out. The potential energy difference of a single Josephson junction is shown by potential energy bar 404.

FIGS. 5A through 12C illustrate detailed write operations, with states of the circuit array under different input select and half-select conditions being depicted. All possible signal combinations starting from the two initial states are shown. Each state is a combination of persistent currents running in the indicated directions through the three current loops in the triangular structure of unit cell internals 200, with d, e, and r_m nodes being indicated, corresponding to the same nodes depicted in FIG. 2. Clockwise currents are denoted by the abbreviation "CW" while counter-clockwise currents are denoted by the abbreviation "CCW." Dots on either sides of the Josephson junctions indicate junction phase transitions that by convention are positive in the direction of the dot. Due to the π Josephson junction phase-shifters, each persistent current is ±½ $\Phi_0$. "No change" means the signal is absorbed by the respective escape junction that connects the circuit node to the address line. For simplicity of illustration, these escape junctions are not shown in FIGS. 5A through 12C, but see Josephson junctions 106, 108, 110 in FIG. 1.

Figures 5A, 5B, 5C:
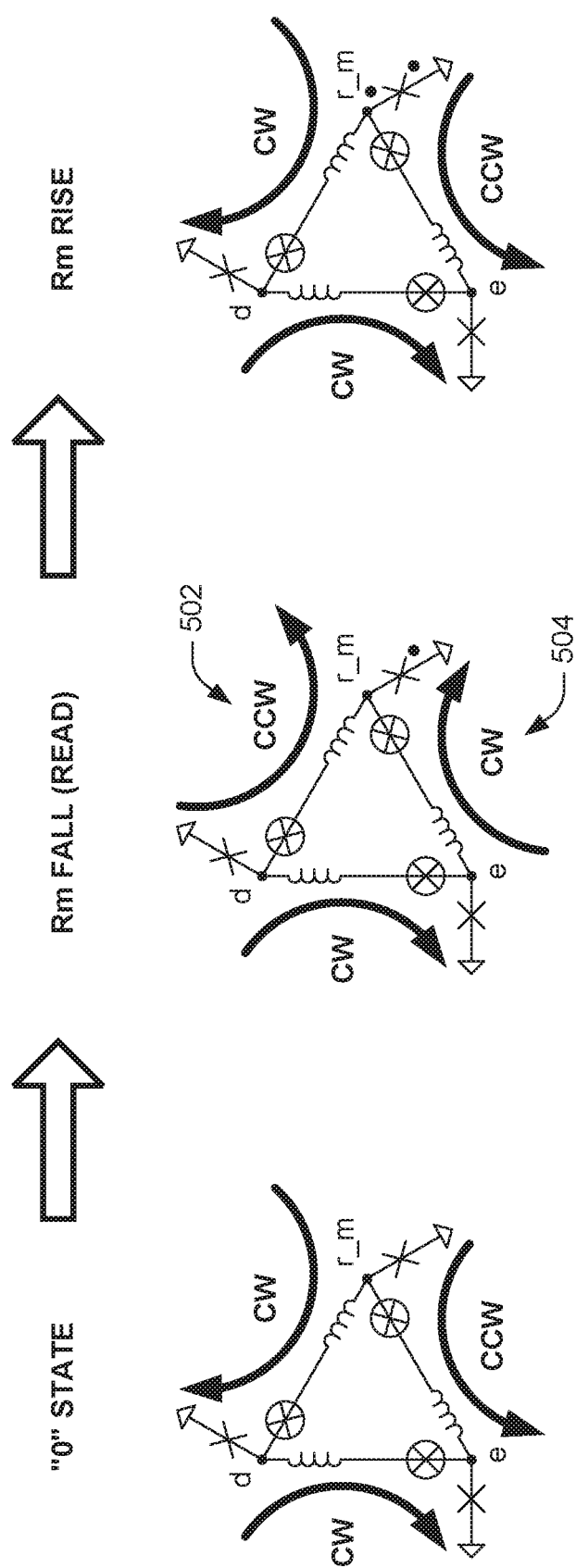
FIGS. 5A-5C are circuit current configuration diagrams showing the effect of a read enable phase pulse transit from a starting "0" state.

FIGS. 5A-5C show the effect on the circuit of a read enable phase pulse transit (i.e., absent a data input pulse contemporaneous to it in the same clock cycle) starting from the "0" memory state of the circuit (i.e., when the illustrated unit cell is storing a logical "0"). Following the "0" state of FIG. 5A, a voltage pulse (e.g., SFQ pulse) corresponding to the initial falling edge of the read enable phase pulse flips the directions of currents 502, 504 in FIG. 5B. Then, a subsequent voltage pulse (e.g., SFQ pulse) of opposite polarity corresponding to the rising edge of the read enable phase pulse again flips the directions of the same currents, placing the circuit back in the original state of FIG. 5A in FIG. 5C.

Figure 6C:
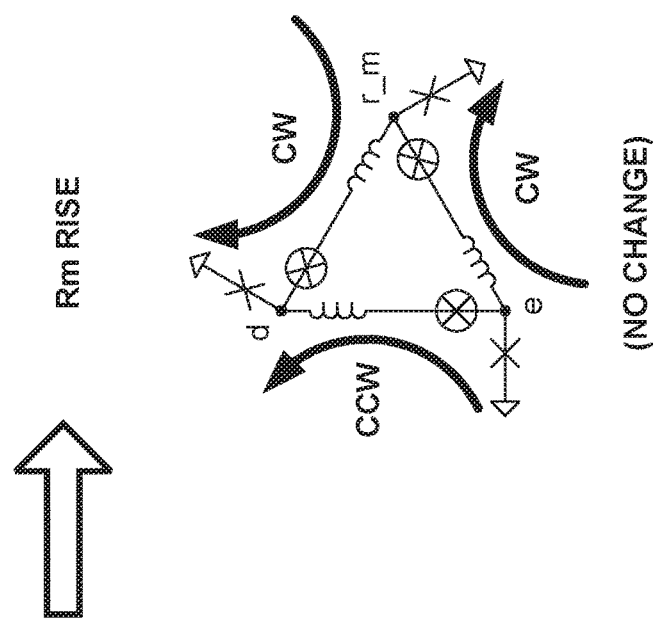
FIGS. 6A-6C are circuit current configuration diagrams showing the effect of a read enable phase pulse transit from a starting "1" state.
Figure 6B:
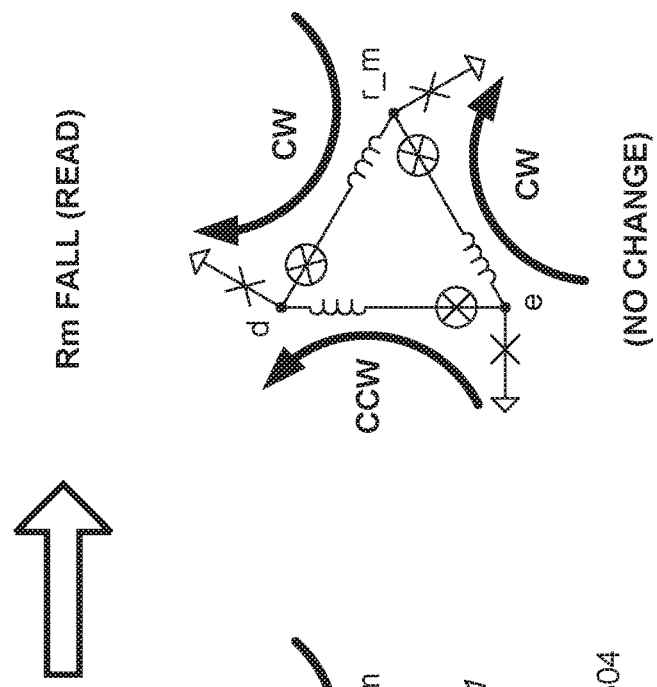
Figure 6A:
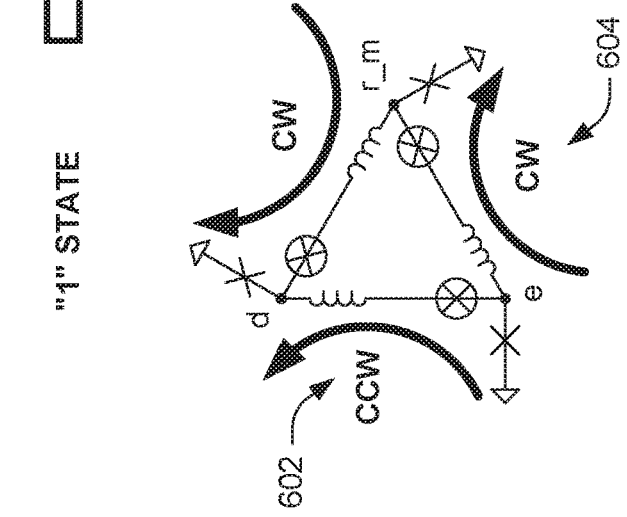

FIGS. 6A-6C show the effect on the circuit of a read enable phase pulse transit (i.e., absent a data input pulse contemporaneous to it in the same clock cycle) starting from the "1" memory state of the circuit (i.e., when the illustrated unit cell is storing a logical "1"). This memory state can be noted from the difference in current directions 602, 604 in FIG. 6A versus their counterparts in FIG. 5A. Following the "1" state of FIG. 6A, a voltage pulse (e.g., SFQ pulse) corresponding to the initial falling edge of the read enable phase pulse has no effect on the directions of currents in FIG. 6B, because the pulse is absorbed by the respective escape junction (e.g., 106 in FIG. 1). Then, a subsequent voltage pulse (e.g., SFQ pulse) of opposite polarity corresponding to the rising edge of the read enable phase pulse again has no effect on the directions of the currents, such that the circuit remains in the original state of FIG. 6A in both FIGS. 6B and 6C.

FIGS. 7A-7C show the effect on the circuit of a write enable phase pulse starting from the "0" memory state of the circuit, without a contemporaneous phase pulse transmitted on the data input line, effectively writing a "0" to a memory unit cell that is already of state "0". Following the "0" state of FIG. 7A, a voltage pulse (e.g., SFQ pulse) corresponding to the initial rising edge of the write enable phase pulse flips the directions of currents 702, 704 in FIG. 7B. Then, a subsequent voltage pulse (e.g., SFQ pulse) of opposite polarity corresponding to the falling edge of the write enable phase pulse again flips the directions of the same currents, placing the circuit back in the original state of FIG. 7A in FIG. 7C. This sequence thus resembles that of FIG. 5A-5C in that the current directions, indicative of the "0" memory state, start and end in the same configuration, but the sequences differ in which currents flip and flop direction during the sequence.

Figure 8C:
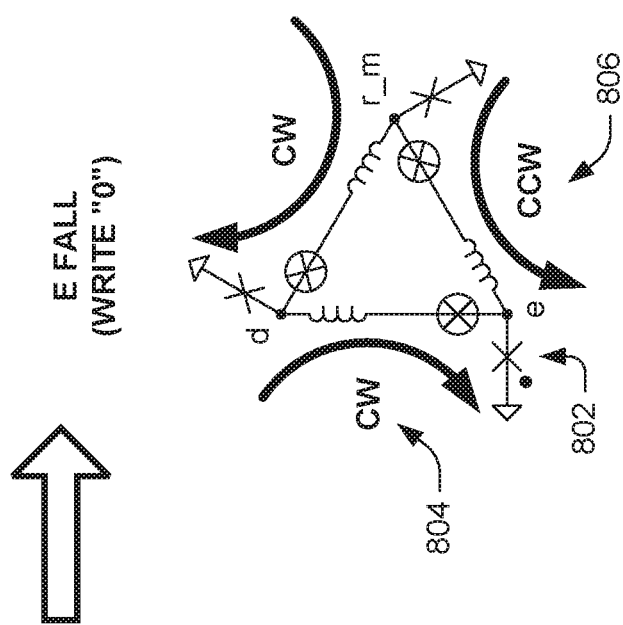
FIGS. 8A-8C are circuit current configuration diagrams showing a write "0" operation from a starting "1" state.
Figure 8B:
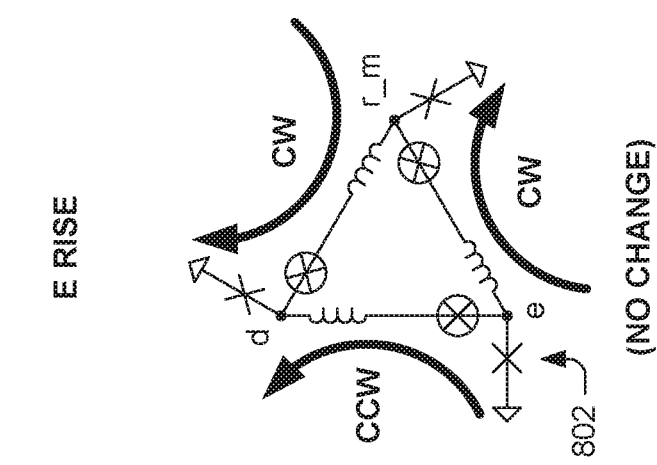
Figure 8A:
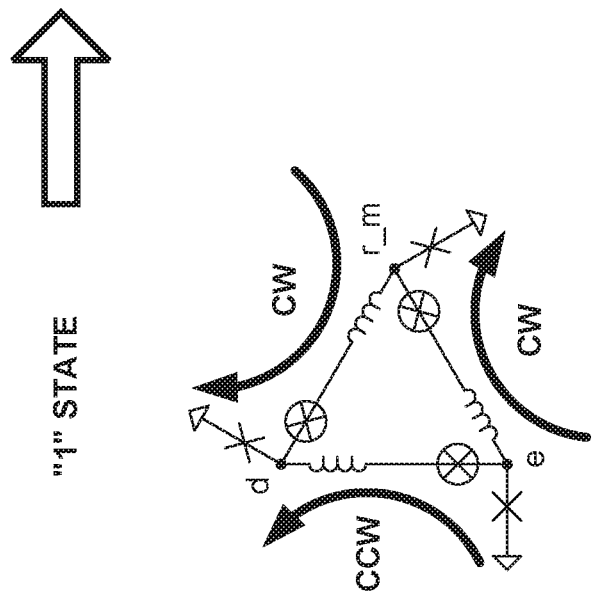

FIGS. 8A-8C show the effect on the circuit of a write enable phase pulse starting from the "1" memory state of the circuit, without a contemporaneous phase pulse transmitted on the data input line, effectively writing a "0" to the memory unit cell. Following the "1" state of FIG. 8A, a voltage pulse (e.g., SFQ pulse) corresponding to the initial rising edge of the write enable phase pulse has no effect on the directions of currents in FIG. 8B, because the pulse is absorbed by the respective escape junction (e.g., 108 in FIG. 1). Josephson junction 802 cannot be triggered by this rising edge because it would effectively be triggering Josephson junction 802 the wrong way. Then, a subsequent voltage pulse (e.g., SFQ pulse) of opposite polarity corresponding to the falling edge of the write enable phase pulse triggers Josephson junction 802 and flips directions of currents on the directions of currents 804, 806, such that the circuit returns to the "0" memory state illustrated in FIGS. 5A and 7A.

Figures 9A, 9B, 9C, 9D, 9E:
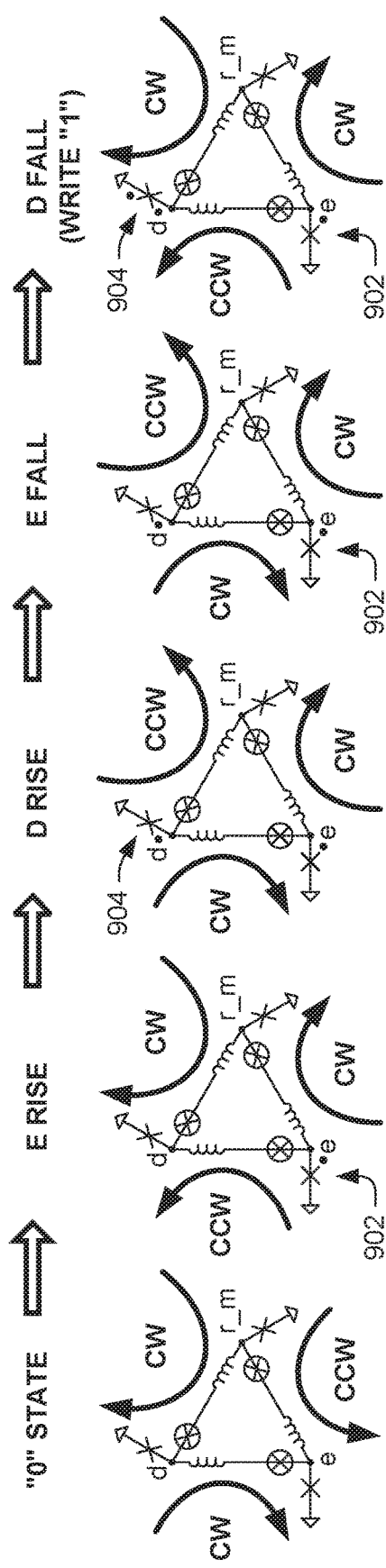
FIGS. 9A-9E are circuit current configuration diagrams showing a write "1" operation from a starting "0" state.

FIGS. 9A-9E show the effect on the circuit of a write enable phase pulse starting from the "0" memory state of the circuit, with a contemporaneous asserted phase pulse transmitted on the data input line, effectively writing a "1" to the memory unit cell. Following the "0" state of FIG. 9A, a voltage pulse (e.g., SFQ pulse) corresponding to the initial rising edge of the write enable phase pulse triggers Josephson junction 902, flipping currents as shown in FIG. 9B. Then, in FIG. 9C, a voltage pulse (e.g., SFQ pulse) corresponding to the initial rising edge of the data input phase pulse triggers Josephson junction 904, flipping currents differently such that the configuration of FIG. 9C differs from both that of FIG. 9B and that of FIG. 9A. At this point, as shown in FIG. 9D, a voltage pulse corresponding to the falling edge of the write enable phase pulse is not able to untrigger Josephson junction 902. It may be observed here that the two currents flowing through Josephson junction 902 are opposite in direction. This is insufficient to untrigger Josephson junction 902. If it were to untrigger, this would result in all three of the currents flowing in the counter-clockwise direction, which is a disallowed circuit condition. Instead, the voltage pulse corresponding to the falling edge of the write enable phase pulse causes the respective escape junction (e.g., 108 in FIG. 1) to trigger in FIG. 9D. Then, the voltage pulse corresponding to the falling edge of the data input phase pulse causes Josephson junction 904 to untrigger in FIG. 9E. It may be noted by the configuration of current directions that the "1" state of FIGS. 6A and 8A has been achieved in FIG. 9E.

Figures 10A, 10B, 10C, 10D, 10E:
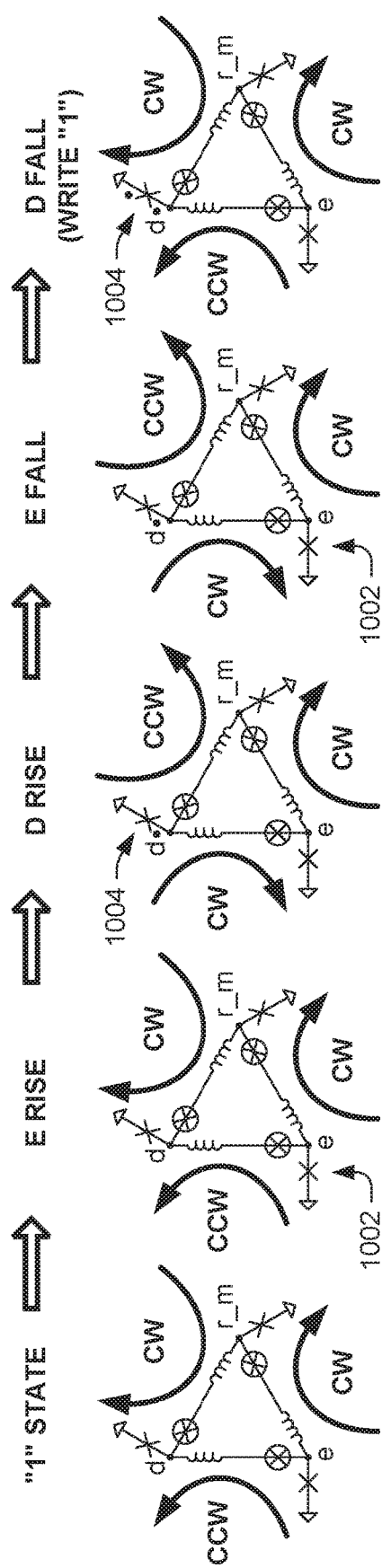
FIGS. 10A-10E are circuit current configuration diagrams showing a write "1" operation from a starting "1" state.

FIGS. 10A-10E show the effect on the circuit of a write enable phase pulse starting from the "1" memory state of the circuit, with a contemporaneous asserted phase pulse transmitted on the data input line, effectively writing a "1" to the memory unit cell that is already of state "1". Following the "1" state of FIG. 10A, a voltage pulse (e.g., SFQ pulse) corresponding to the initial rising edge of the write enable phase pulse cannot trigger Josephson junction 1002, and so triggers respective escape junction (e.g., 108 in FIG. 1), with the result that no currents are flipped in FIG. 10B. Then, in FIG. 10C, a voltage pulse (e.g., SFQ pulse) corresponding to the initial rising edge of the data input phase pulse triggers Josephson junction 1004, temporarily changing the current configuration by flipping two currents. At this point, as shown in FIG. 10D, a voltage pulse corresponding to the falling edge of the write enable phase pulse is also not able to trigger Josephson junction 1002, for the reason discussed previously with respect to FIG. 9D. Instead, the voltage pulse corresponding to the falling edge of the write enable phase pulse causes the respective escape junction (e.g., 108 in FIG. 1) to untrigger in FIG. 10D. Then, the voltage pulse corresponding to the falling edge of the data input phase pulse causes Josephson junction 1004 to untrigger in FIG. 10E, effectively placing the current configuration the same as it was before the rising edge of the data input phase pulse. Thus, the "1" state is maintained at the end of the sequence.

FIGS. 11A-11C illustrate the "0" state half-select condition, i.e., the effect on the circuit of a data input phase pulse without a contemporaneous phase pulse transmitted on the write enable line, in this case when the circuit is starting from the "0" state. In memory design, it can be important that memory unit cells can tolerate signals bypassing them (on the data input line, for instance) which signals are on their way to x-y addressing some other unit cell in the memory fabric, without such signals affecting a memory unit cell to which it is not addressed. Following the "0" state of FIG. 11A, a voltage pulse (e.g., SFQ pulse) corresponding to the initial rising edge of the data input phase pulse has no effect on the directions of currents in FIG. 11B, because the pulse is absorbed by the respective escape junction (e.g., 110 in FIG. 1). Josephson junction 1102 cannot be triggered by this rising edge because it would effectively be triggering Josephson junction 1102 the wrong way. Then, a subsequent voltage pulse (e.g., SFQ pulse) of opposite polarity corresponding to the falling edge of the data input phase pulse untriggers the same escape junction. Accordingly, the memory unit cell circuit experiences no change in current direction configuration and thus no change in memory state, which is the desired behavior of the half-select condition. The circuit remains in the "0" memory state.

FIGS. 12A-12C illustrate the "1" state half-select condition, i.e., the effect on the circuit of a data input phase pulse without a contemporaneous phase pulse transmitted on the write enable line, in this case when the circuit is starting from the "1" state (FIG. 12A). In contrast to the "0" state half-select condition, in the "1" state half-select, the rising edge of the data input phase pulse does cause Josephson junction 1202 to trigger (FIG. 12B), disrupting the current direction configuration by changing the directions of currents 1204, 1206, but the falling edge of the data input phase pulse causes Josephson junction 1202 to subsequently untrigger, placing the circuit back in the state (FIG. 12C). The "1" state half-selection condition is thus only a transient disturbance to the circuit state, lasting the duration of the data input phase pulse.

The initialization protocols of FIGS. 13A-13C show a way to initialize all cells to a known and valid state, starting from an unknown phase-initialization ($\pm\pi$) of each $\pi$ Josephson junction. All of the states illustrated in FIGS. 5A through 12C involve one counter-clockwise loop current and two clockwise loop currents. In an alternate chirality, the individual circuit states can involve two counter-clockwise loop currents and one clockwise loop current. Triggering Josephson junctions in the illustrated circuits cannot change the initial-state chirality, because each such triggering changes two current directions, not just one. Initialization of the 7C Josephson junctions to three clockwise or three counter-clockwise states would result in a non-functional cell, but these are not among the low-energy states so it is expected they will not occur during initialization. However, if the circuit initializes with one clockwise and two counter-clockwise loop currents, the circuit will not operate properly. Each cell will have the loop currents illustrated in FIG. 13A after a write "1" operation. In other words, only one of the two possible initial-state chiralities is functional. Therefore, circuit components can be provided to the unit cell sub-circuit produce operable-chirality initialization. As shown in FIG. 13B, for example, an initialization Josephson junction JINIT and a control line 1302, inductively coupled to the sub-circuit via an inductor in the same arm of the sub-circuit as the initialization Josephson junction, can be provided to reverse the counter-clockwise current 1304 to a clockwise current 1306 (FIG. 13C) in an initialization procedure that ramps a control current provided through the control line 1302 up to a prescribed value and then back to zero. Resultantly, each memory unit cell can be initialized to a known state of the operable chirality. For example, the memory array can be initialized to a "1" state for every unit cell in the array, followed by activation of the control line 1302 for every unit cell, ensuring that every unit cell in the array is then in a "0" state of the valid chirality (compare FIG. 13C to FIG. 5A, both showing the "0" state).

Figure 14:
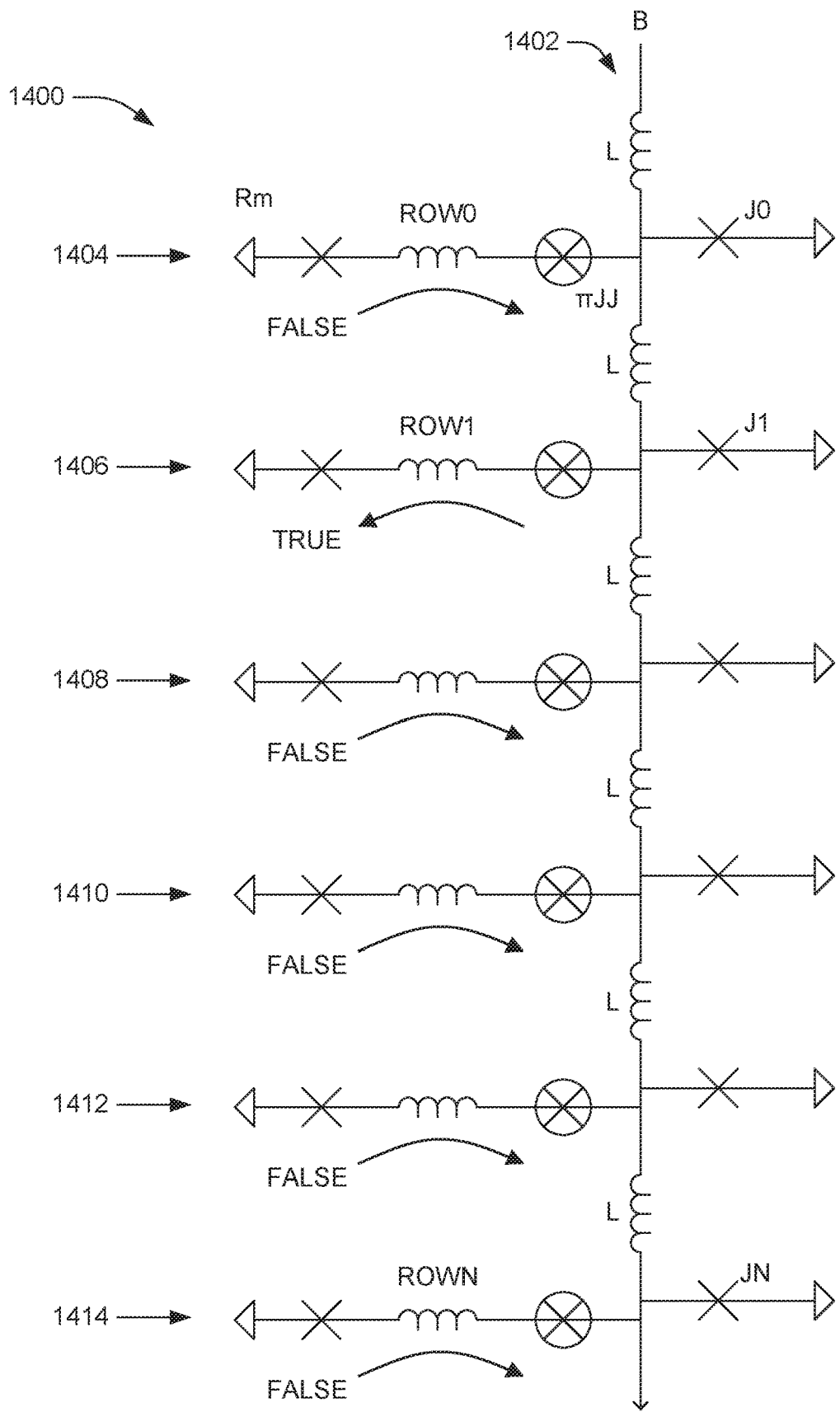
FIG. 14 is a circuit diagram of an example read path portion of a memory array.

FIG. 14 details the read path 1400, with six unit cell stages 1404, 1406, 1408, 1410, 1412, 1414 illustrated as an example. Only the part of each unit cell relevant to the read operation is illustrated; the remainder of the unit cell is omitted for clarity. Effectively, as shown in the bit line 1402 is coupled only to the Rm junction in each unit cell illustrated. Stages 1404, 1408, 1410, 1412, and 1414 all have clockwise currents through the illustrated arm of the respective unit cell; only stage 1406 has a counter-clockwise current through its arm. In the illustrated example, stage 1406 ("ROW1") is the stage currently being read. The cells that are not being read are guaranteed, irrespective of their internal state, to have clockwise currents (as shown), such that a pilot phase pulse propagating down the bit line 1402 can pass through each of them, whereas the cell being read, if in the "1" state, will have a counter-clockwise current (as shown for stage 1406), and if in the "0" state, will have a clockwise current. Consequently, a pilot phase pulse will be blocked at stage 1406, which is in the "1" state as illustrated.

Figure 15:
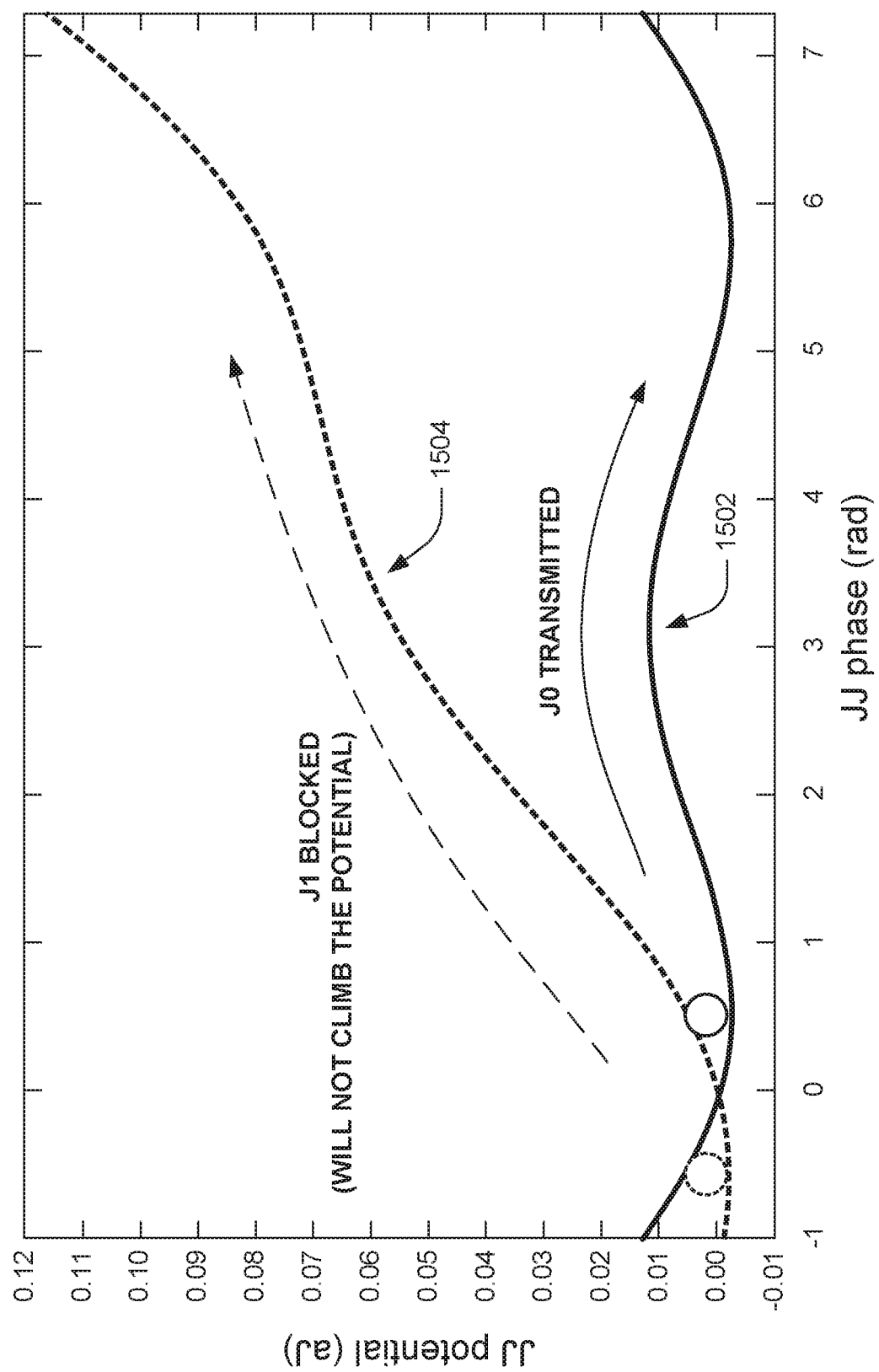
FIG. 15 is an example energy diagram.

Thus, NOR logic is used, wherein the pilot phase pulse is conditionally blocked at the cell being read, dependent on the state of that cell. As with the write lines, the bit line 1402 (i.e., the read line) can use small-value inductors L, resulting in high density and speed. The readout circuit of the array can be a wide-input NOR gate. A first voltage pulse of the pilot phase pulse input at B is conditionally blocked at each input, as shown by the potential diagram of FIG. 15 (showing the potential only for one stage, e.g., stage 1406, "ROW1"). If the direction of current in a stage in FIG. 14 is clockwise, the regular transmission line dynamics permit this voltage pulse to get over the potential energy hump 1502 and end up back where it started, energetically speaking, as the voltage pulse rolls through the transmission line 1402. If, on the other hand, the direction of current in a stage in FIG. 14 is counter-clockwise, plot 1504 shows that it is highly energetically unfavorable or impossible to trigger the Josephson junction in the direction that would be required for further propagation of the voltage pulse down the bit line 1402. This causes the voltage pulse either to reflect or to be stored and annihilated by its counterpart opposite-polarity voltage pulse half a clock cycle later when RQL data encoding is used.

Figure 16:
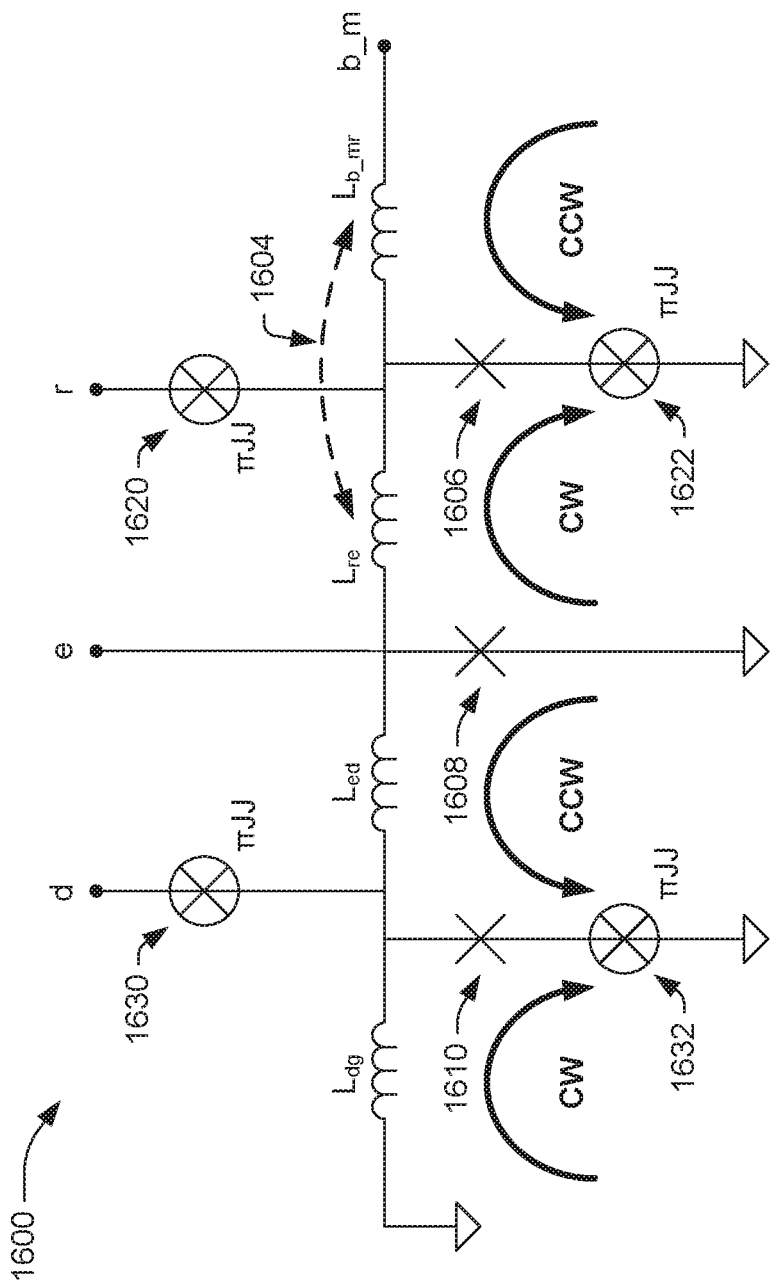
FIG. 16 is a circuit diagram of an example internal sub-circuit of a memory unit cell having a linear configuration.

FIG. 16 illustrates an example linear implementation 1600 of the unit cell sub-circuit 102 that, as compared to the circular implementation 200 of the sub-circuit 102 illustrated in FIG. 2, has better initialization properties at the expense of unequal potential energy levels for the different states (absent mutual inductance configuration among inductors, as discussed below). In linear sub-circuit implementation 1600, a linear array always initializes to the correct state simply by exercising the write and read functions, irrespective of the initial state of the 7C Josephson junctions (i.e., there is no issue of the circuit initializing to the incorrect chirality, as described with regard to FIG. 13A). However, in linear implementation 1600, the potential energy levels of the different states are not equal (cf. FIG. 4), unless mutual inductance (e.g., mutual inductance 1604) is introduced between adjacent pairs of inductors. Providing mutual inductance between each pair of inductors can achieve full degeneracy. Mutual inductance 1604 only between one pair of inductors can be provided as illustrated to achieve degeneracy with respect to the bit line pulse, which is the most important degeneracy to achieve. Also, in linear implementation 1600 as compared to circular implementation 200, it is the data output signal (here labeled b_m), not the read enable signal (here labeled r), that is the mirrored signal, meaning that appropriate polarity inversion can be provided at the ends of the bit line on the periphery of a memory array composed of unit cells implemented as linear implementation 1600, rather than on the ends of the read enable line.

In implementation 1600 of FIG. 16, every π Josephson junction has a Josephson junction in series with it. Two of these Josephson junctions are shown (Josephson junction 1606 is in series with π Josephson junction 1622, Josephson junction 1610 is in series with π Josephson junction 1632), whereas the other two (paired with π Josephson junctions 1620, 1630) are not shown in FIG. 16 but are the respective escape junctions (e.g., 106, 110 in FIG. 1). The series order of a Josephson junction in series with a it Josephson junction can be reversed without material change to the operation of the circuit. A Josephson junction in series with a a Josephson junction can be fabricated as a single device. The initial current directions (CW or CCW) are as illustrated.

Figure 17:
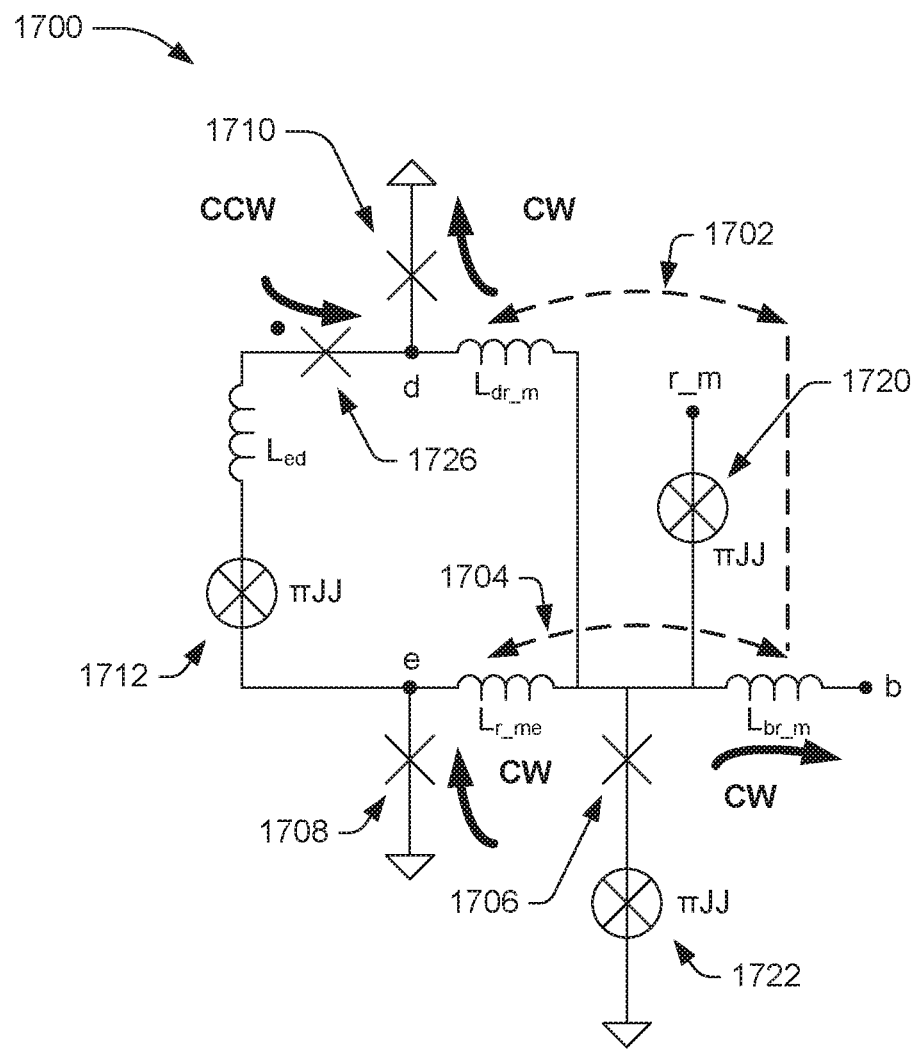
FIG. 17 is a circuit diagram of another example internal sub-circuit of a memory unit cell.

FIG. 17 illustrates another example implementation 1700 of the unit cell sub-circuit 102 that, as compared to the implementations 200 and 1600, uses only three π Josephson junctions 1712, 1720, 1722 instead of four. As with implementation 200, mutual inductances 1702, 1704 can be provided to promote equal potential energy levels. An initialization current can be provided to a transformer coupling to inductor $L_{ed}$ as part of an initialization protocol that also includes first writing a "1" to the memory unit cell. As with implementation 200, the read enable signal is the mirrored signal. As illustrated, Josephson junction 1706 is in series with, and can be fabricated as the same device as, it Josephson junction 1722. Similarly, Josephson junction 1726 is in series with, and can be fabricated as the same device as, a Josephson junction 1712. A Josephson junction 1708 can be coupled between the write enable node e and ground. A Josephson junction 1710 can be coupled between the data input node d and ground. The current directions (CW or CCW) following initialization are as illustrated.

Figure 18:
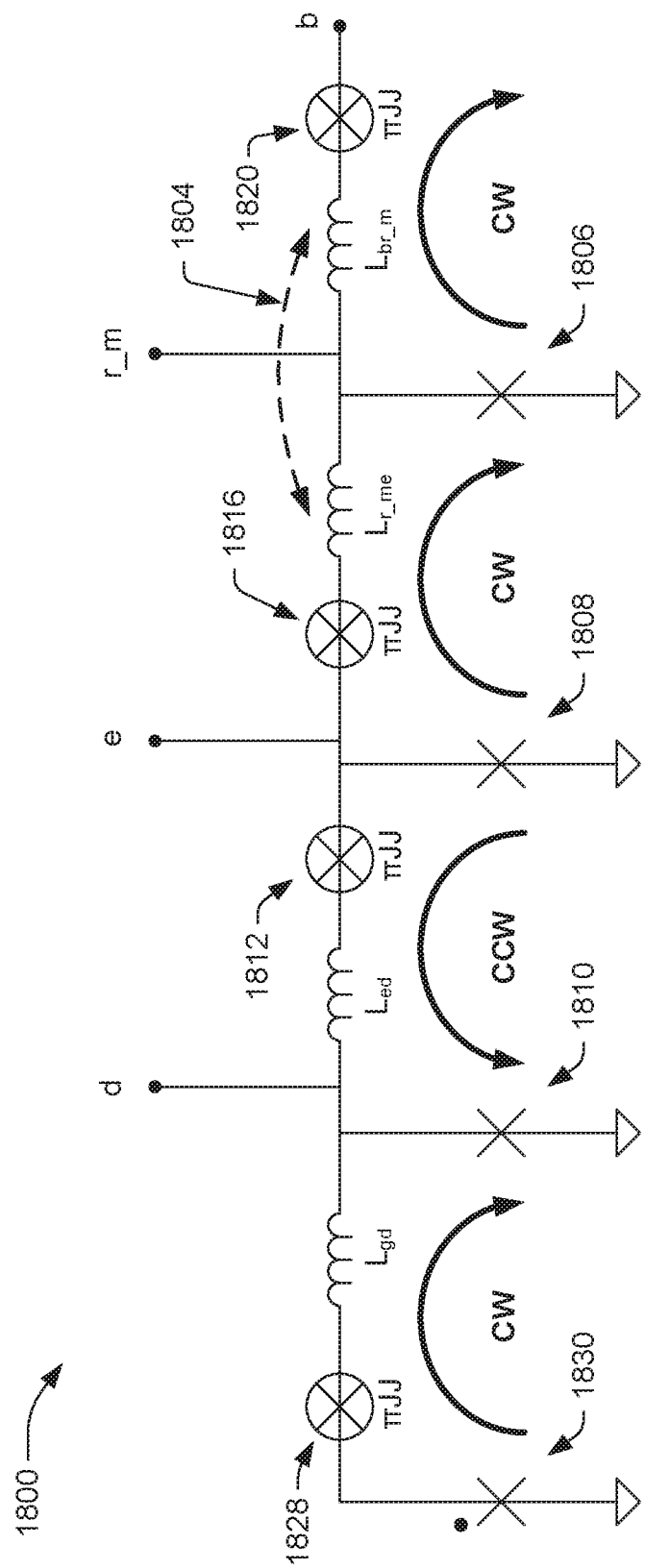
FIG. 18 is a circuit diagram of another example internal sub-circuit of a memory unit cell having a linear configuration.

FIG. 18 illustrates another example linear implementation 1800 of the unit cell sub-circuit 102 that includes π Josephson junctions 1828, 1812, 1816, 1820 and Josephson junctions 1830, 1810, 1808, 1806. Mutual inductance 1804 can be provided to promote equal potential energy levels. An initialization current can be provided to a transformer coupling to inductor $L_{gd}$ as part of an initialization protocol (a "1" need not be first written to the unit cell). As with implementation 200, the read enable signal is the mirrored signal. The current directions (CW or CCW) following initialization are as illustrated.

The circuits described herein have good parametric operating margins, low component count, and provide efficiency and cost advantages as compared to other implementations. For the purposes of this description, a 7C Josephson junction and a Josephson junction are distinct circuit components, and one cannot be interpreted as the other, although, as mentioned above, it is possible to fabricate the two as one physical device.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A Josephson memory array comprising a plurality of unit cells, each of the plurality of unit cells comprising:

an internal sub-circuit comprising a plurality of 7C Josephson junctions, and first, second, third, and fourth quasi-long-Josephson-junction interconnects, each coupled to the internal sub-circuit at different electrical nodes of the sub-circuit, the interconnects including:

a write enable line configured to enable writing a binary memory state to the unit cell, a read enable line configured to enable reading the binary memory state from the unit cell, a data input line configured to provide the binary memory state to the unit cell, and a bit line configured to read out the binary memory state from the unit cell, wherein each of the first, second, third, and fourth quasi-long-Josephson-junction interconnects is adapted to connect together multiple ones of the plurality of unit cells in the memory array.

2. The Josephson memory array of claim 1, wherein the first, second, third, and fourth quasi-long-Josephson-junction interconnects do not fan out.

3. The Josephson memory array of claim 1, wherein for each of the plurality of unit cells, the data input line, the write enable line, and the read enable line are each coupled to the respective different electrical node of the sub-circuit via a respective escape Josephson junction.

4. The Josephson memory array of claim 1, wherein for each of the plurality of unit cells, the electrical node of the sub-circuit to which the write enable line is connected, the electrical node of the sub-circuit to which the data input line is connected, and the electrical node of the sub-circuit to which the read enable line is connected are each coupled to ground via a respective Josephson junction in the sub-circuit.

5. The Josephson memory array of claim 1, wherein each of the quasi-long-Josephson-junction interconnects is a Josephson transmission line having connecting inductors of between about one picohenry and about ten picohenries.

6. The Josephson memory array of claim 1, wherein for at least one of the plurality of unit cells, the internal sub-circuit comprises:

a write enable node coupled to the write enable line;
a read enable node coupled to the read enable line;
a data input node coupled to the data input line;
a data output node coupled to the bit line;
a first of the plurality of π Josephson junctions coupled between the write enable node and the data input node;
a second of the plurality of π Josephson junctions coupled between the data input node and the read enable node;
a third of the plurality of π Josephson junctions coupled between the read enable node and the write enable node; and
a fourth of the plurality of π Josephson junctions coupled between the read enable node and the data output node,
such that a looped current path is formed to include the read enable node, the write enable node, and the data input node.

7. The Josephson memory array of claim 6, wherein for the least one of the plurality of unit cells, the internal sub-circuit further comprises:

a first inductor coupled between the write enable node and the data input node;
a second inductor coupled between the data input node and the read enable node;
a third inductor coupled between the read enable node and the write enable node; and
a fourth inductor coupled between the read enable node and the data output node.

8. The Josephson memory array of claim 7, wherein for at the least one of the plurality of unit cells, the second inductor is inductively coupled to the fourth inductor and the third inductor is inductively coupled to the fourth inductor.

9. The Josephson memory array of claim 7, the at least one of the plurality of unit cells further comprising an initialization Josephson junction coupled between the write enable node and the data input node, and a control line inductively coupled to the first inductor, the control line being configured to provide a control current to initialize the sub-circuit to a known memory state and an operable current direction chirality.

10. The Josephson memory array of claim 6, the at least one of the plurality of unit cells having a plurality of different memory states and configured such that the total potential energy of the at least one unit cell in each of the plurality of different memory states is equal, apart from during switching transients that occur between memory states.

11. The Josephson memory array of claim 1, wherein for at least one of the plurality of unit cells, the internal sub-circuit comprises:

first and second electrical nodes;
a write enable node coupled to the write enable line;
a read enable node coupled to the read enable line;
a data input node coupled to the data input line;
a data output node coupled to the bit line;
a first of the plurality of 7C Josephson junctions coupled between the first electrical node and ground;
a second of the plurality of 7C Josephson junctions coupled between the first electrical node and the data input node;
a third of the plurality of 7C Josephson junctions coupled between the read enable node and the second electrical node;
a fourth of the plurality of 7C Josephson junctions coupled between the second electrical node and ground;
a first Josephson junction in series with or in the same device as the first 7C Josephson junction;
a second Josephson junction in series with or in the same device as the fourth 7C Josephson junction; and
a third Josephson junction coupled between the write enable node and ground,
wherein the write enable node is between the first and second electrical nodes.

12. The Josephson memory array of claim 11, wherein for the at least one of the plurality of unit cells, the internal sub-circuit further comprises:

a first inductor coupled between the first electrical node and ground;
a second inductor coupled between the first electrical node and the write enable node;
a third inductor coupled between the second electrical node and the write enable node; and
a fourth inductor coupled between the second electrical node and the data output node.

13. The Josephson memory array of claim 12, wherein the first inductor is mutually coupled to the second inductor, the second inductor is mutually coupled to the third inductor, and the third inductor is mutually coupled to the fourth inductor, such that the total potential energy of the unit cell in each of the different memory states is equal, apart from during switching transients that occur between memory states.

14. The Josephson memory array of claim 1, wherein for at least one of the plurality of unit cells, the internal sub-circuit comprises:
- a first electrical node;
- a write enable node coupled to the write enable line;
- a read enable node coupled to the read enable line;
- a data input node coupled to the data input line;
- a data output node coupled to the bit line;
- a first of the plurality of π Josephson junctions coupled between the first electrical node and ground;
- a second of the plurality of π Josephson junctions coupled between the read enable node and the first electrical node;
- a third of the plurality of π Josephson junctions coupled between the write enable node and the data input node;
- a first Josephson junction in series with or in the same device as the first 7C Josephson junction;
- a second Josephson junction in series with or in the same device as the third it Josephson junction;
- a third Josephson junction coupled between the write enable node and ground; and
- a fourth Josephson junction coupled between the data input node and ground,
- such that a looped current path is formed to include the first electrical node, the write enable node, and the data input node.

15. The Josephson memory array of claim 1, wherein for at least one of the plurality of unit cells, the internal sub-circuit comprises:
- a first electrical node;
- a write enable node coupled to the write enable line;
- a read enable node coupled to the read enable line;
- a data input node coupled to the data input line;
- a data output node coupled to the bit line;
- a first of the plurality of π Josephson junctions coupled between the first electrical node and the data input node;
- a second of the plurality of π Josephson junctions coupled between the data input node and the write enable node;
- a third of the plurality of π Josephson junctions coupled between the write enable node and the read enable node;
- a fourth of the plurality of π Josephson junctions coupled between the read enable node and the data output node;
- a first Josephson junction in series with or in the same device as the first 7C Josephson junction;
- a second Josephson junction coupled between the data input node and ground;
- a third Josephson junction coupled between the write enable node and ground; and
- a fourth Josephson junction coupled between the read enable node and ground,
- wherein the write enable node is between the data input node and the read enable node.

16. A method of memory access in a non-destructive superconducting memory array, the method comprising:
- propagating a pilot voltage pulse at least partway down a quasi-long-Josephson-junction interconnect arranged as a bit line coupled to a plurality of memory unit cells in the superconducting memory array at respective data output nodes and configured to provide data output from the memory unit cells in the superconducting memory array, the bit line having a terminus at the periphery of the memory array;
- at each respective data output node, either continuing to propagate the pilot voltage pulse down the bit line or absorbing the pilot voltage pulse based on a direction of a superconducting current circulating in a respective arm of one of the plurality of memory unit cells coupled to the respective data output node;
- determining a binary memory state of the addressed one of the plurality of memory unit cells based on whether the pilot voltage pulse propagates to the terminus of the bit line.

17. The method of claim 16, further comprising determining that the memory state of the addressed memory unit cell is logical "1" based on the pilot voltage pulse not propagating to the terminus of the bit line.

18. The method of claim 16, further comprising addressing the addressed memory unit cell by propagating, in about a same clock cycle as the propagating the pilot voltage pulse, a read enable voltage pulse across a second quasi-long-Josephson-junction interconnect arranged as a read enable line coupled to a plurality of memory unit cells in the superconducting memory array at respective read enable nodes, the read enable line being orthogonal to the bit line in the superconducting memory array.

19. A method of memory writing in a superconducting memory array, the method comprising:
- propagating a data voltage pulse down a quasi-long-Josephson-junction interconnect arranged as a data input line coupled to a plurality of memory unit cells in the superconducting memory array at respective data input nodes and configured to provide data input to the memory unit cells in the superconducting memory array; and
- based on the propagating the data voltage pulse, reversing directions of superconducting currents circulating in different current paths of an addressed one of the memory unit cells,
- wherein a written binary memory state of the addressed memory unit cell is based on the directions of the superconducting currents.

20. The method of claim 19, wherein two of the superconducting currents circulate clockwise in the addressed memory unit cell and a third of the superconducting currents circulates counter-clockwise in the addressed memory unit cell.

21. The method of claim 19, further comprising addressing the addressed memory unit cell by propagating, in about a same clock cycle as the propagating the data voltage pulse, a write enable voltage pulse across a second quasi-long-Josephson-junction interconnect arranged as a write enable line coupled to a plurality of memory unit cells in the superconducting memory array at respective write enable nodes, the write enable line being orthogonal to the data input line in the superconducting memory array.

* * * * *